United States Patent
Ro et al.

(10) Patent No.: US 6,303,999 B1
(45) Date of Patent: Oct. 16, 2001

(54) INTERCONNECT STRUCTURE WITH A PASSIVATION LAYER AND CHIP PAD

(75) Inventors: Tae-Hyo Ro, Seoul; Ill-Hwan Jeoun, Suwon; Byung-Suk Park, Suwon; Yeon-Hong Jee, Suwon, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/209,644

(22) Filed: Dec. 10, 1998

(30) Foreign Application Priority Data

Dec. 12, 1997 (KR) .................................................. 97-68237

(51) Int. Cl.[7] ............................. H01L 23/48; H01L 23/52
(52) U.S. Cl. ......................... 257/781; 257/784; 257/786; 257/760; 257/758; 257/764
(58) Field of Search ..................................... 257/760, 758, 257/764, 763, 773, 774, 780, 781, 784, 786; 438/618, 622, 623–625

(56) References Cited

U.S. PATENT DOCUMENTS

| | | | |
|---|---|---|---|
| 5,036,382 | * 7/1991 | Yamaha | 357/71 |
| 5,616,519 | * 4/1997 | Ping | 438/626 |
| 5,635,763 | * 6/1997 | Inoue et al. | 257/763 |
| 5,641,992 | * 6/1997 | Lee et al. | 257/762 |
| 5,719,448 | * 2/1998 | Ichikawa | 257/781 |
| 5,838,023 | * 11/1998 | Goel et al. | 257/48 |
| 5,883,433 | * 3/1999 | Oda | 257/750 |
| 5,937,324 | * 8/1999 | Abercrombie et al. | 438/648 |
| 6,005,291 | * 12/1999 | Koyanagi et al. | 257/751 |
| 6,136,729 | * 10/2000 | Hopper et al. | 438/778 |

FOREIGN PATENT DOCUMENTS

| | | | |
|---|---|---|---|
| 359055037A | * 3/1984 | (JP) | 21/88 |

* cited by examiner

Primary Examiner—Steven Loke
Assistant Examiner—Douglas W. Owens
(74) Attorney, Agent, or Firm—Marger Johnson & McCollom, P.C.

(57) ABSTRACT

The semiconductor device includes a silicon substrate, a first metal pattern layer which is deposited on the silicon substrate, and an inter metal dielectric which is deposited on the silicon substrate including the first metal pattern layer and on which a connection hole is formed to partially expose the upper surface of the first metal pattern layer, the connection hole having concave corner portion formed on a side thereof. A second metal pattern layer is deposited on the inter metal dielectric and electriacally interconnects to the first metal pattern layer by the connection hole. A passivation layer coats the silicon substrate including the second metal pattern layer and the concave corner portion and has an opening to partially expose the second metal pattern layer for electrically connecting the semiconductor device to external circuitry. The passivation layer extends beyond the concave corner portion such that when the passivation layer is etched, the concave corner portion remains coated with the passivation layer to thereby protect the concave corner portion from damage due to subsequent processes. The first metal pattern layer comprises a Ti/TiN layer, an Al layer, and a TiN layer, and the second metal pattern layer comprises a Ti layer and an Al layer.

12 Claims, 5 Drawing Sheets

INTERCONNECT STRUCTURE WITH A PASSIVATION LAYER AND CHIP PAD

BACKGROUND OF THE INVENTION

1. Field of the Invention

The present invention generally relates to a semiconductor device and a method for manufacturing the same, and more particularly to a semiconductor device having a structure of coating an edge of a connection hole of a metal pattern layer among plural metal pattern layers with a passivation layer, the metal pattern layer which will be a chip pad, and a method for manufacturing the same.

2. Description of the Related Arts

Semiconductor devices are fabricated on a silicon substrate using successive steps of photolithography, etching, diffusion, and deposition.

A deposition step refers to a kind of the material synthesis process, in which a desired thin layer is obtained by changing a specific element or compound from the source in a gas or vapor phase into a solid phase. In the manufacturing of the semiconductor device, thin layers of silicon oxide, silicon nitride, various metals and/or suicide are required. All the thin layers are obtained by the deposition step.

The deposition step is also referred to as a thin film formation process, and is divided includes two methods, that is, a PVD (Physical Vapor Deposition) and a CVD (Chemical Vapor Deposition). The physical vapor deposition is a deposition method, in which a desired thin layer is deposited only by changing a phase of the source, without adding or omitting other components to or from the source. On the other hand, chemical vapor deposition includes the chemical reactions, so there are differences in a physical and a chemical structure between the kind of source and the deposited product. Generally, a sputtering method is used for the physical vapor deposition.

Among the above-described deposition steps, a metallization step means a metal wiring step, in which aluminum (Al) with the thickness of about 6,000 Å is deposited on the silicon substrate to electrically interconnect a plurality of the semiconductor devices foiled on the upper surface of the silicon substrate to each other, and to form chip pads for electrically connecting the semiconductor devices to external circuitry.

A method for manufacturing a semiconductor device using a conventional deposition step will be described hereinafter, with reference to FIG. 1 through FIG. 4.

FIG. 1 schematically shows a coating of a passivation layer 17 on an upper surface of a silicon substrate 10, where a plurality of metal pattern layers 12, 14 are formed, in order to manufacture a plurality of semiconductor devices (30 in FIG. 4) on the silicon substrate 10, and FIG. 2 is a cross-sectional view taken along the line 2—2 in FIG. 1. With reference to FIG. 1 and FIG. 2, a first metal pattern layer 12 is deposited on the upper surface of the silicon substrate 10. And, the first metal pattern layer 12 is electrically insulated from a second metal pattern layer 14 by interposing an inter metal dielectric 16(IMD) between the first metal pattern layer 12 and the second metal pattern layer 14. To electrically interconnect the first metal pattern layer 12 to the second metal pattern layer 14, a connection hole 15 is formed by selectively removing, the inter metal dielectric 16 on a designated portion. A designated portion of the second metal pattern layer 14 is used as a chip pad (19 in FIG. 4). The upper surface of the silicon substrate including an upper surface of the second metal pattern layer 14 is coated with the passivation layer 17.

Herein, the first metal pattern layer 12 is formed by successively depositing a Ti/TiN layer 12b, an Al layer 12a, and a TiN layer 12c on the upper surface of the silicon substrate 10. The second metal pattern layer 14 is formed by successively depositing a Ti layer 14b and an Al layer 14a on an upper surface of the Al layer 12a of the first metal pattern layer 12. Generally, all the layers are deposited by sputtering. The TiN layer 12c of the first metal pattern layer 12 is positioned between the lower surface of the inter metal dielectric 16 and the upper surface of the Al layer 12a of the first metal pattern layer 12, and the Ti/TiN layer 12b of the first metal pattern layer 12 is used as a barrier metal layer.

The connection hole 15 is formed by selectively removing a portion of the inter metal dielectric 16 after depositing the first metal pattern layer 12 and the inter metal dielectric 16 on the silicon substrate 10. Consequently, the upper surface of the silicon substrate 10 including the first metal pattern layer 12 and the inter metal dielectric 16 is uneven and stepwise. Therefore, the second metal pattern layer 14 deposited on the upper surfaces of the first metal pattern layer 12 and the inter metal dielectric 16, is formed with the uneven thickness. Described in more detail, a concave corner 14c is formed along an edge 13, where the first metal pattern layer 12 is in contact with the inter metal dielectric 16, in which the second metal is thinner in the thickness than that of any other portion of the second metal pattern layer 14. Accordingly, the concave corner 14c having a bad step coverage is formed on the edge 13, where the first metal pattern layer 12 is in contact with the inter metal dielectric 16.

The reason that the concave corner 14c is formed on the second metal pattern layer 14 will be described hereinafter. The second metal pattern layer 14 is deposited on the upper surfaces of the first metal pattern layer 12 including the connection hole 15, and the inter metal dielectric 16 by sputtering. In sputtering, Ar atoms are accelerated and collide with a target in the vacuum condition. In the present invention, the target is made of an Al (Aluminum) and a Ti (Titanium) plate. Molecules of the target material are broken off by the colliding of the Ar atoms and deposited on the upper surface of the silicon substrate 10. At this time, the number of the particles of the components of the target, which is deposited on the vertical surface of the silicon substrate 10 to the target, is fewer than that of the components, which is deposited on the horizontal surface of the silicon substrate 10 to the target. Particularly, the number of the particles of target material deposited on the edge 13, on which the first metal pattern layer 12 is in contact with the inter metal dielectric 16, is fewer than that of the target material deposited on any other portion of the silicon substrate 10. As described above, since the number of the particles of target material deposited on the edge 13 is fewest, the concave corner 14c of the second metal pattern layer 14 is indented toward the edge 13.

The passivation layer 17 is composed of PEOX (Plasma Enhanced silicon Oxide) and silicon nitride (Si3N4). Reference numeral 17a refers to a point or boundary for etching the passivation layer 17 to expose a portion of the second metal pattern layer 14 to the outside, the portion which will be a chip pad (19 in FIG. 4), that is, the chip pad portion of the second metal pattern layer 14. The etched point 17a is disposed along an outer periphery of the connection hole 15.

Then, a photo-etching step is carried out for removing a portion of the passivation layer 17 on the upper surface of the second metal pattern layer 14 to expose the chip pad portion of the second metal pattern layer 14 to the outside. As shown in FIG. 3, an upper surface of the passivation layer 17 is coated with a photoresist 18 and a developing step is carried out for removing the photoresist 18 of the upper surface of the chip to expose the pad portion of the second metal pattern layer 14. After that, as shown in FIG. 4, a portion of the passivation layer 17 is removed from the upper surface of the chip pad portion of the second metal pattern layer 14 by the dry etching method, and an ashing/ strip step is carried out for removing the photoresist 18 remaining on the silicon substrate 10. Accordingly, a semiconductor device 30, on which a plurality of the chip pads are formed on the silicon substrate 10 by partially exposing the Al layer 14a of the second metal pattern layer 14, is manufactured. Herein, a boundary or point 18a in FIG. 3, where a pad pattern of the photoresist 18 is formed by developing the photoresist 18, coincides with the etched boundary or point 17a in FIG. 1. The chip pad 19 includes a portion of the second metal pattern layer 14, the portion contacting the upper surface of the first metal pattern layer 12, and partially another portion of the second metal pattern layer 14, positioned on the upper surface of the inter metal dielectric 16 along the periphery of the connection hole 15.

The semiconductor device 30 which is manufactured by the above-described steps has several problems as follows. Since the concave corner 14c is exposed to the outside during the photo-etching and the ashing step for removing the photoresist 18, it may be attacked due to its relative thin thickness and a failure such as separation of the Al layer 14a along the concave corner 14c may occur. After that, chemicals used in the strip step for removing the photoresist 18 may react with the Ti layer 14b under the cutting Al layer 14a, contaminating or damaging the Ti layer 14b.

Also, under the baking process following the formation of the protective layer such as a polyimide layer (not shown in FIG. 4), a failure such as separation of the Al layer 14a along the concave corner 14c with relatively thin thickness may occur. Therefore, during the ball bonding process after the manufacturing of the semiconductor device, the Al layer 14a of the second metal pattern layer 14 separate and exfoliate or peel from the Al layer 12a of the first metal pattern layer 12.

SUMMARY OF THE INVENTION

Accordingly, an object of the present invention is to provide a semiconductor device, which prevents separation of the Al layer along the concave corner of the second metal pattern layer and exfoliation of the second metal pattern layer from the first metal pattern layer. And, another object of the present invention is to provide a method for manufacturing the above described semiconductor device.

To achieve the foregoing and other various objects, the present invention provides a semiconductor device comprising a silicon substrate, a first metal pattern layer which is deposited on the silicon substrate, an inter metal dielectric which is deposited on the silicon substrate including the first metal pattern layer and through which a connection hole is formed to partially expose the upper surface of the first metal pattern layer, a second metal pattern layer which is deposited on the inter metal dielectric and electrically interconnected to the first metal pattern layer via the connection hole, and a passivation layer which coats the silicon substrate including the second metal pattern layer and has an opening to partially expose the second metal pattern layer for electrically connecting the semiconductor device to external circuitry. The first metal pattern layer preferably has a structure of successive depositions of a Ti/TiN layer, an Al layer, and a TiN layer on the upper surface of the silicon substrate, and the second metal pattern layer preferably has a structure of successive depositions of a Ti layer and an Al layer on the upper surfaces of the first metal pattern layer and inter metal dielectric. The passivation layer coats a portion of the second metal pattern layer disposed on an inner portion of the connection hole and protects the portion from subsequent fabrication process.

In another aspect, the present invention provides a method for manufacturing a semiconductor device. This method for manufacturing the semiconductor device comprises steps of preparing a silicon substrate, depositing a first metal pattern layer on the silicon substrate, coating the silicon substrate including the first metal pattern layer with an inter metal dielectric and forming a connection hole by etching the inter metal dielectric to partially expose the upper surface of the first metal pattern layer, depositing a second metal pattern layer, which is electrically interconnected to the first metal pattern layer by the connection hole, on the silicon substrate, and coating the upper surfaces of the second metal pattern layer and the inter metal dielectric with a passivation layer and etching the passivation layer to partially expose the second metal pattern layer on the upper surface of the first metal pattern layer. The passivation layer coats a portion of the second metal pattern layer, the portion being disposed on an inner portion of the connection hole.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
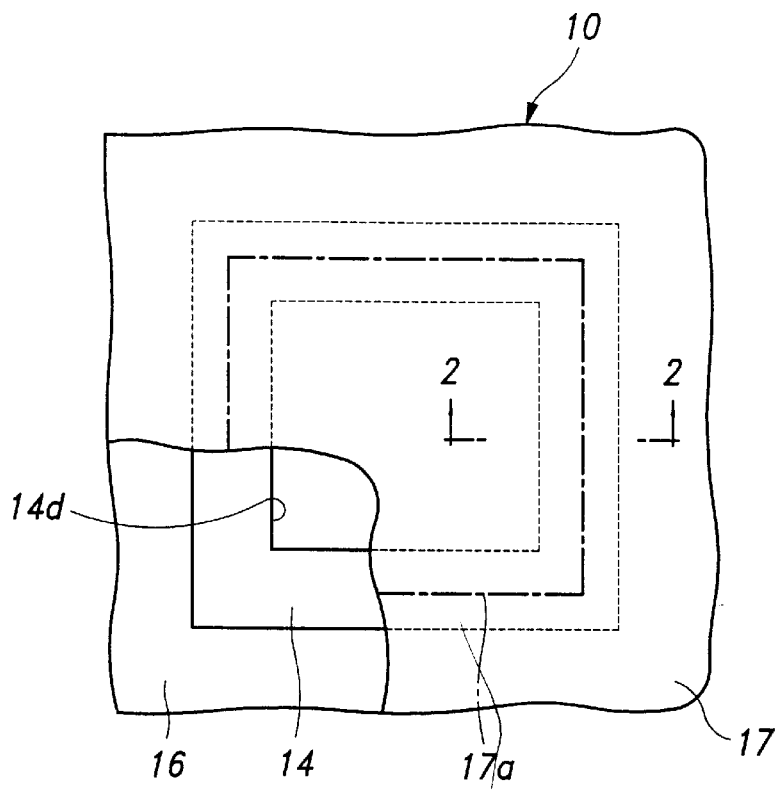
FIG. 1 is a schematic plane view, which is partially cut away, showing a coating of a passivation layer on a silicon substrate according to a conventional method for manufacturing a semiconductor device.
Figure 2:
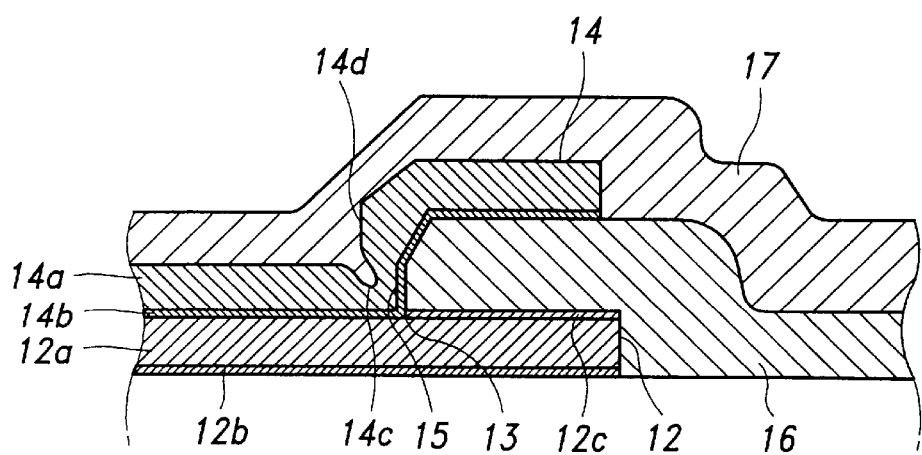
FIG. 2 through FIG. 4 are cross-sectional views taken along line 2—2 in FIG. 1 showing the conventional method for manufacturing the semiconductor device by etching the passivation layer along the periphery of a connection hole for a second metal pattern layer.
Figure 3:
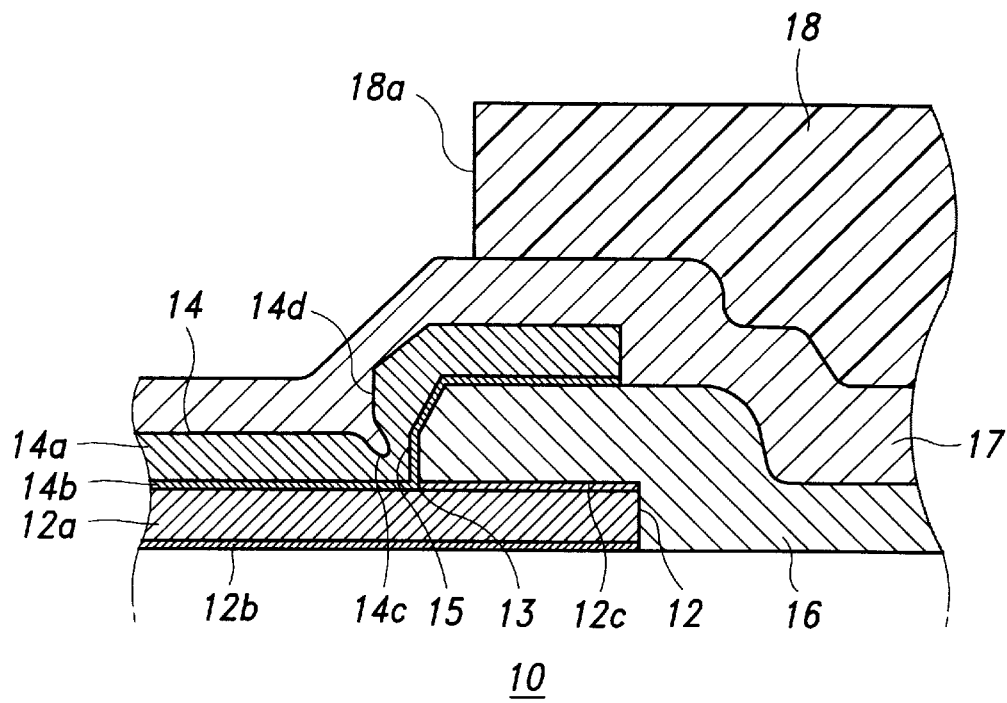
Figure 4:
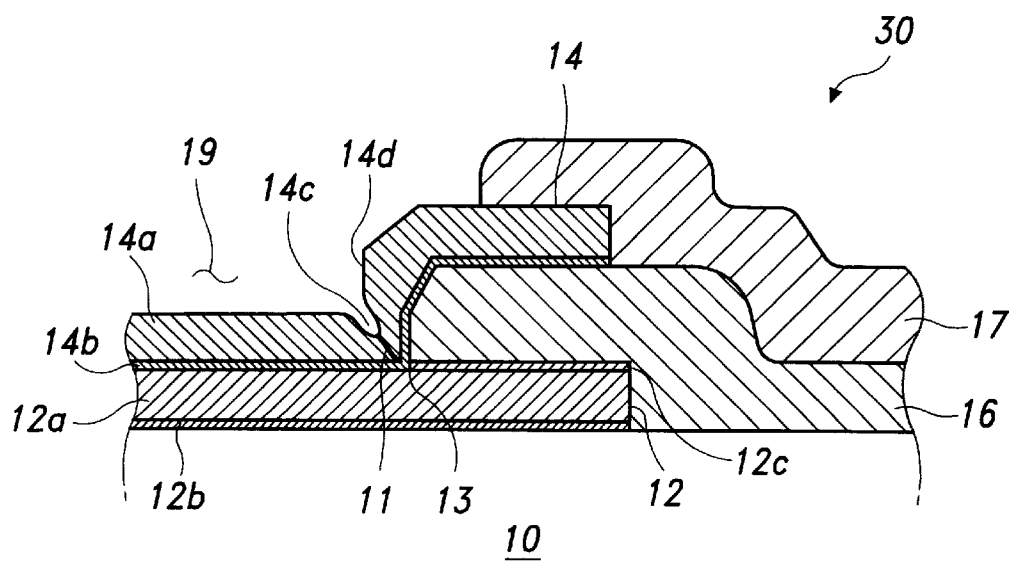
Figure 5:
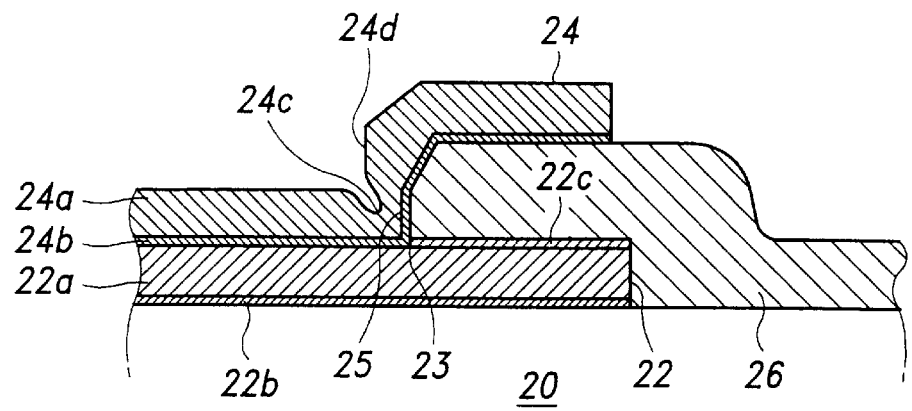
FIG. 5 is a cross-sectional view showing a plurality of metal pattern layers on the silicon substrate in a method for manufacturing a semiconductor device according to the present invention.

FIG. 5 through FIG. 9 show manufacturing steps of a semiconductor device on a silicon substrate. With reference to FIG. 5, a silicon substrate 20 is prepared and a first metal pattern layer 22 is deposited on an upper surface of the silicon substrate 20. And, an inter metal dielectric 26 is deposited on the upper surfaces of the first metal pattern layer 22 and the silicon substrate 20. A connection hole 25 for electrically interconnecting the first metal pattern layer 22 to a second metal pattern layer 24 is formed by etching the inter metal dielectric 26 on a designated portion, so that the upper surface of the first metal pattern layer 22 is exposed. The second metal layer is deposited on the upper surface of the first metal pattern layer 22 including within the connection hole 25 and on the inter metal dielectric 26. A second metal pattern layer 24 is formed by etching the second metal layer, except portions of the second metal layer contacting the upper surface of a margin of the first metal pattern layer 22 and the upper surface of the inter metal dielectric 26 adjacent to the first metal pattern layer 22. That is, the second metal layer is a metal layer, which is deposited on the upper surfaces of the first metal pattern layer 22 and the inter metal dielectric 26, and represents a layer before being patterned into the second metal pattern layer 24. An exposed portion of the second metal pattern layer 24 is used as a chip pad (29 in FIG. 9).

The first metal pattern layer 22 is deposited on the silicon substrate 20 by sputtering and has a structure of successive depositions of a Ti/TiN layer 22b, an Al layer 22a, and a TiN layer 22c on the upper surface of the silicon substrate 20. Preferably, the Ti/TiN layer 22b is composed of a Ti layer with the thickness of about 200 Å and a TiN layer with a thickness of about 1,000 Å and therefore, has a total thickness of about 1,300 Å. The Al layer 22a is deposited on the upper surface of the Ti/TiN layer 22b with a thickness of about 6,000 Å. The TiN layer 22c is deposited with a thickness of about 250 Å between the lower surface of the inter metal dielectric 26 and the upper surface of the Al layer 22a of the first metal pattern layer 22. The Ti/TiN layer 22b of the first metal pattern layer 22 is used as a barrier metal layer.

The second metal pattern layer 24 is deposited on the upper surfaces of the first metal pattern layer 22 and the inter metal dielectric 26 by sputtering and has a structure of successive depositions of a Ti layer 24b and an Al layer 24a. The Ti layer 24b is deposited with a thickness of about 500 Å on the upper surfaces of the Al layer 22a of the first metal pattern layer 22 and a margin of the inter metal dielectric 26 adjacent to the connection hole 25. The Al layer 24a is deposited with the thickness of about 8,000 Å on the upper surface of the Ti layer 24b. Meanwhile, a concave corner 24c is formed along an edge 23, where the first metal pattern layer 12 is in contact with the inter metal dielectric 16. In this corner, the metal layer 24 is thinner in the thickness than that of any other portion of the second metal pattern layer 24. Therefore, the concave corner 24c of the second metal pattern layer 24 is indented toward the edge 23.

Figure 6:
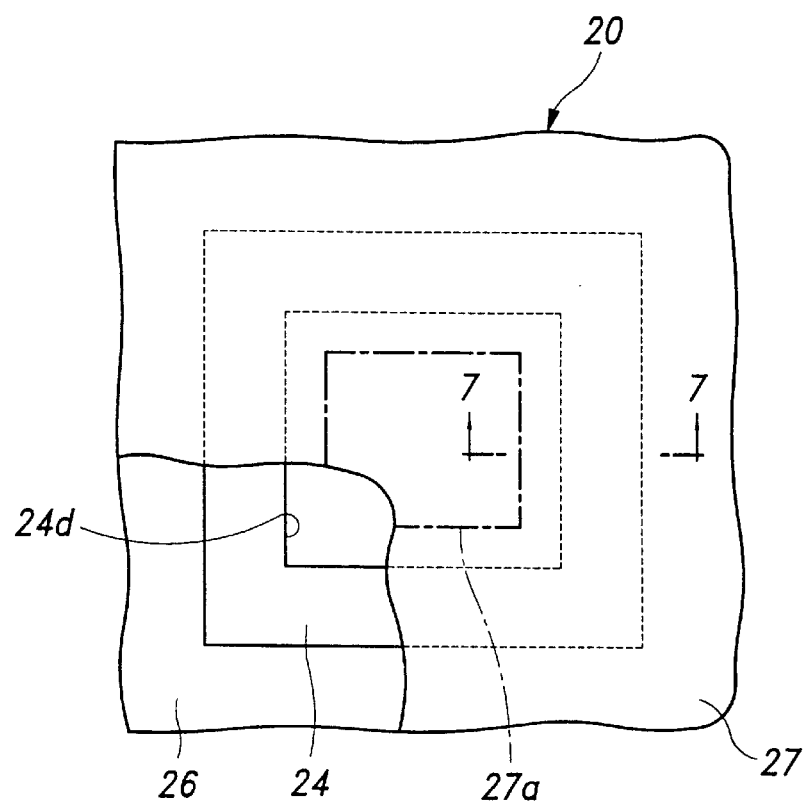
FIG. 6 is a schematic plane view, which is partially cut away, showing a coating of a passivation layer on the silicon substrate of FIG. 5.

Herein, FIG. 5 is a cross-sectional view showing the second metal pattern layer 24 as deposited on the silicon substrate 20 before coating with the passivation layer (27 in FIG. 6). FIG. 6 is a schematic plan view of a chip pad portion (29 in FIG. 9) of the first and the second metal pattern layer 22, 24, which is partially cut away, showing the passivation layer 27 on the silicon substrate 20. FIG. 6, from which the passivation layer 27 removed, is a schematic plan view corresponding to the cross-section of FIG. 5.

Figure 7:
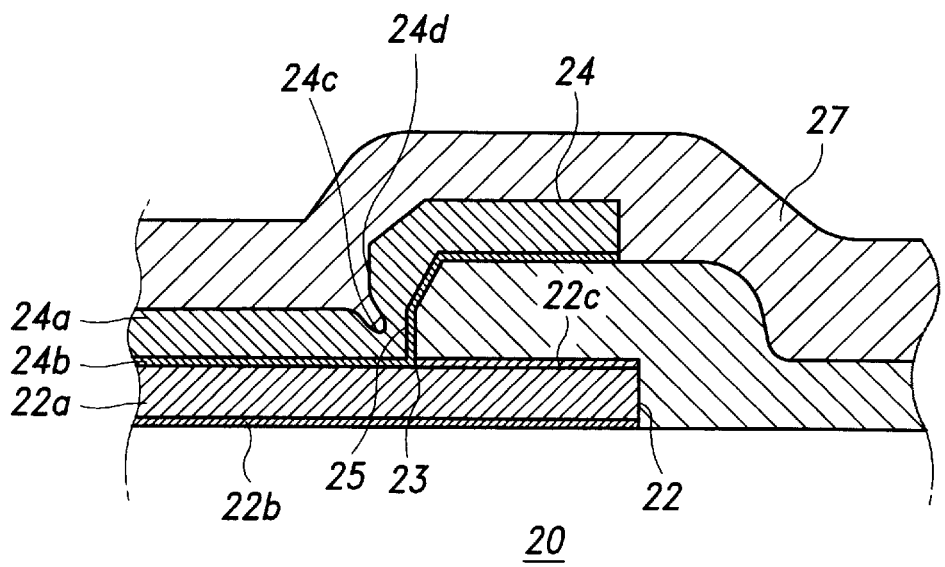
FIG. 7 is a cross-sectional view taken along the line 7—7 in FIG. 6.

As shown in FIG. 6 and FIG. 7, the passivation layer 27, which is made of PEOX (Plasma Enhanced silicon Oxide) and silicon nitride ($Si_3N_4$), is deposited to protect the upper surface of the silicon substrate 20 including the second metal pattern layer 24.

Figure 8:
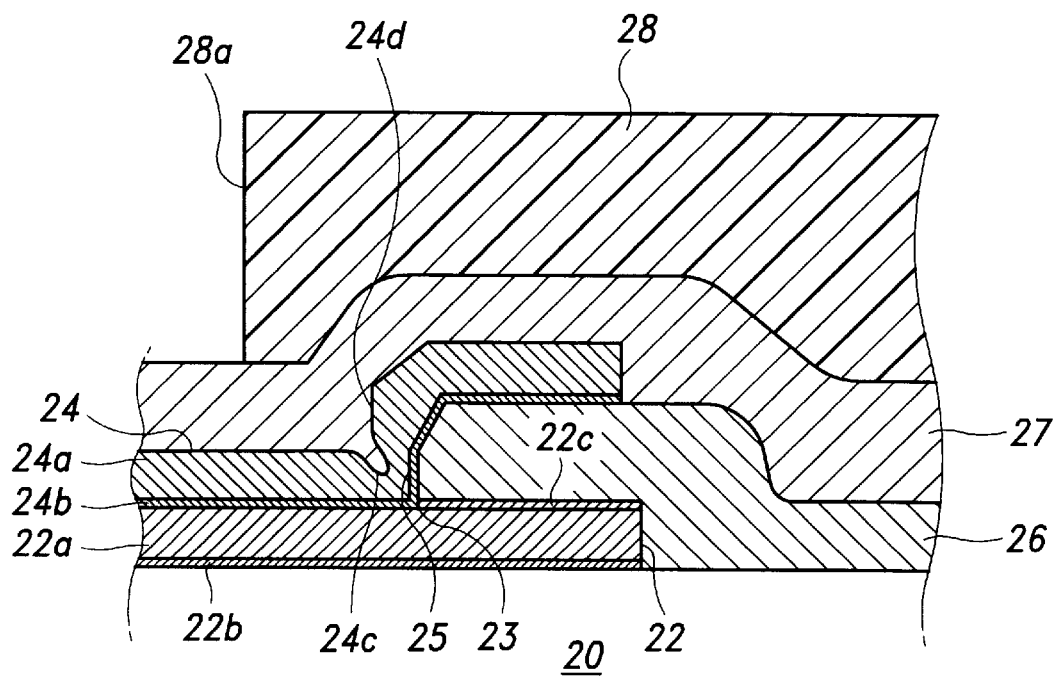
FIG. 8 is a cross-sectional view similar to FIG. 7 showing a coating and a developing of a photoresist layer in order to etch the passivation layer within an inner portion of a connection hole for the second metal pattern layer.
Figure 9:
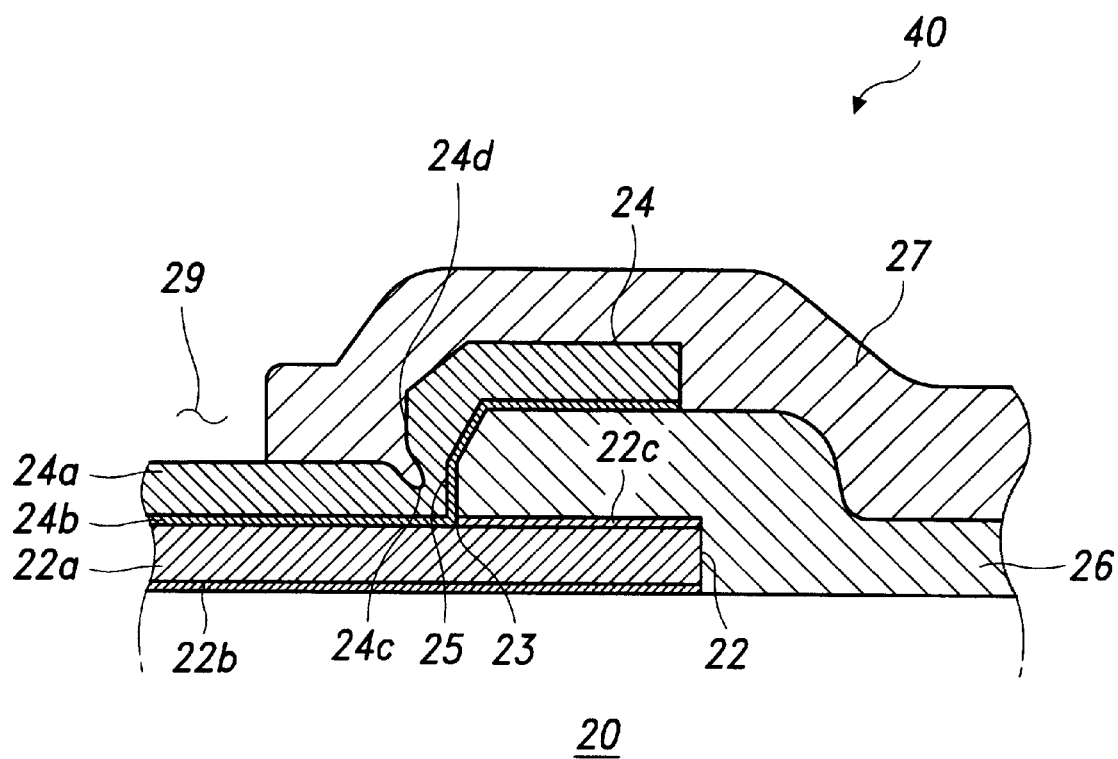
FIG. 9 is a cross-sectional view similar to FIG. 8 showing the semiconductor device, which is manufactured by etching the passivation layer within the inner portion of the connection hole for the second metal pattern layer.

As shown in FIG. 8 and FIG. 9, the photo-etching step is carried out for removing the passivation layer 27 from the upper surface of the second metal pattern layer 24 to expose the chip pad portion of the second metal pattern layer 24 to the outside. As shown in FIG. 8, reference numeral 27a refers to a point or boundary for etching the passivation layer 27 to expose a portion of the second metal pattern layer 24 which will be a chip pad (29 in FIG. 9), that is, the chip pad portion of the second metal pattern layer, and the upper surface of the passivation layer 27 is coated with photoresist 28 and the developing step is carried out for removing the photoresist 28 from the upper surface of the chip pad portion of the second metal pattern layer 24. Herein, a boundary or point 28a in FIG. 8, where a pad pattern of the photoresist 28 is formed by developing the photoresist 28, coincides with the etched boundary or point 27a in FIG. 6.

And, as shown in FIG. 9, after removing the passivation layer 27 from the upper surface of the chip pad portion of the second metal pattern layer 24 by the dry etching method and forming an opening, on which the second metal pattern layer 24 is partially exposed, the ashing/strip step for removing the photoresist 27 remaining on the silicon substrate 20 is carried out. Accordingly, a semiconductor device 40 is manufactured, on which a plurality of the chip pads 29 as external connection terminals are formed on the silicon substrate 20 by partially exposing the Al layer 24a of the second metal pattern layer 24.

For the conventional case, the passivation layer is etched so that the concave of the second metal pattern layer is exposed to the outside. However, according to the present invention, the etched point 27a is designated so that it is located on the inner portion of the chip pad portion 24a of the second metal pattern layer 24, and the passivation layer extends over concave corner 24c. Accordingly, although the passivation layer 27 is etched to form the chip pad 29, the concave 24c is still coated with the passivation layer 27 and thereby, it protects the concave corner 24c of the second metal pattern layer 24 from the action of the chemicals which are used in the ashing/strip process for removing the photoresist 28.

Although a preferred embodiment of the present invention has described the semiconductor device 40 having double metal pattern layers 22, 24, the present invention may be applied to any semiconductor device having plural metal pattern layers, in which a connection hole of an uppermost metal pattern layer is coated with the passivation layer, and a method for manufacturing the semiconductor device.

Further, although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor device, comprising:
    a silicon substrate;
    a first metal pattern layer deposited on the silicon substrate;
    an inter metal dielectric deposited on the silicon substrate including the first metal pattern layer and through which a connection hole is formed to partially expose an upper surface of the first metal pattern layer, the connection hole having concave corner portion formed on a side thereof;
    a second metal pattern layer deposited on the inter metal dielectric and electrically interconnected to the first metal pattern layer by the connection hole; and a passivation layer coating the silicon substrate including the second metal pattern layer and the concave corner portion and having an opening to partially expose the second metal pattern layer for electrically connecting the semiconductor device to external circuitry, wherein the passivation layer extends beyond the concave corner portion such that when the passivation layer is etched, the concave corner portion remains coated with the passivation layer to thereby protect the concave corner portion from damage.

2. The semiconductor device of claim 1, wherein the first metal pattern layer comprises a Ti/TiN layer which is deposited on the upper surface of the silicon substrate and an Al layer which is deposited on the upper surface of the Ti/TiN layer.

3. The semiconductor device of claim 2, wherein the first metal pattern layer further comprises a Ti layer which is deposited between the upper surface of the Al layer of the first metal pattern layer and the lower surface of the inter metal dielectric.

4. The semiconductor device of claim 2, wherein the second metal pattern layer comprises a Ti layer which is deposited on the upper surface of the Al layer of the first metal pattern layer and the upper surface of the inter metal dielectric adjacent to the connection hole, and an Al layer which is deposited on the upper surface of the Ti layer.

5. The semiconductor device of claim 1, wherein the first and the second metal pattern layer are deposited by a sputtering method.

6. The semiconductor device of claim 2, wherein the first and the second metal pattern layer are deposited by a sputtering method.

7. The semiconductor device of claim 3, wherein the first and the second metal pattern layer are formed by a sputtering method.

8. The semiconductor device of claim 1, wherein the passivation layer is made of a PEOX (Plasma Enhanced silicon Oxide) layer and a silicon nitride layer.

9. A semiconductor device, comprising:

a silicon substrate;

a first metal pattern layer deposited on the silicon substrate;

an inter metal dielectric deposited on the silicon substrate including the first metal pattern layer and through which a connection hole is formed to partially expose an upper surface of the first metal pattern layer;

a second metal pattern layer deposited on the inter metal dielectric and electrically interconnected to the first metal pattern layer by the connection hole; and a passivation layer coating the silicon substrate including the second metal pattern layer and a concave corner portion of the second metal pattern layer, wherein the passivation layer has an opening defining an inner portion of a chip pad portion of the second metal pattern layer and wherein the passivation layer extends over the concave corner portion of the second metal pattern layer in the connection hole.

10. The semiconductor device of claim 9, wherein the passivation layer is made of a silicon nitride.

11. A semiconductor device, comprising:

a silicon substrate;

a first metal pattern layer deposited on the silicon substrate;

an inter metal dielectric deposited on the silicon substrate including the first metal pattern layer and through which a connection hole is formed to partially expose an upper surface of the first metal pattern layer;

a second metal pattern layer deposited on the inter metal dielectric and electrically interconnected to the first metal pattern layer by the connection hole; and a passivation layer coating the silicon substrate including the second metal pattern layer and a concave corner portion of the second metal pattern layer and having an opening to partially expose the second metal pattern layer for an electrical chip pad portion, wherein the passivation layer is formed by:

depositing a passivation layer on the upper surface of the silicon substrate; and etching the passivation layer in the connection hole so that an etched portion of the passivation layer is located on the inner portion of the chip pad portion of the second metal pattern layer.

12. The semiconductor device of claim 11, wherein the passivation layer is made of a silicon nitride.

* * * * *

UNITED STATES PATENT AND TRADEMARK OFFICE
CERTIFICATE OF CORRECTION

PATENT NO. : 6,303,999 B1
DATED : October 16, 2001
INVENTOR(S) : Ro et al.

It is certified that error appears in the above-identified patent and that said Letters Patent is hereby corrected as shown below:

Title page, Item [54] and Column 1, lines 1-2,
Title, "INTERCONNECT STRUCTURE WITH A PASSIVATION LAYER AND CHIP PAD" should read -- SEMICONDUCTOR DEVICE AND METHOD FOR MANUFACTURING THE SAME --.

Column 1,
Line 22, "suicide" should read -- silicide --.
Line 40, "foiled" should read -- formed --.
Line 62, "removing, the" should read -- removing the --.
Line 62, "substrate" should read -- substrate 10 --.

Column 5,
Line 29, "1,000Å" should read -- 1,100Å --.

Column 6,
Lines 62-64, "layer, the connection hole having concave corner portion formed on a side thereof;" should read -- layer; --.
Line 67, "connection hole; and" should read -- connection hole, the second metal pattern layer having a concave corner portion formed on a side thereof; and --.

Column 7,
Line 8, "etched, the" should read -- etched to form a chip pad, the --.
Line 10, "damage." should read -- damage, the chip pad being defined on sides and bottom by sides of the passivation layer and a tip of the second metal layer, respectively, such that the chip pad does not extend over the concave corner portion. --.

Signed and Sealed this

Eighth Day of April, 2003

JAMES E. ROGAN
*Director of the United States Patent and Trademark Office*